United States Patent
Sutardja et al.

(10) Patent No.: US 7,622,731 B2
(45) Date of Patent: Nov. 24, 2009

(54) CROSS-POINT MEMORY ARRAY

(75) Inventors: Pantas Sutardja, Los Gatos, CA (US); Albert Wu, Palo Alto, CA (US)

(73) Assignee: Marvell World Trade Ltd, St. Michael (BB)

( * ) Notice: Subject to any disclaimer, the term of this patent is extended or adjusted under 35 U.S.C. 154(b) by 0 days.

(21) Appl. No.: 11/709,631

(22) Filed: Feb. 22, 2007

(65) Prior Publication Data

US 2007/0215910 A1 Sep. 20, 2007

Related U.S. Application Data

(63) Continuation of application No. 11/637,967, filed on Dec. 13, 2006.

(60) Provisional application No. 60/782,379, filed on Mar. 15, 2006.

(51) Int. Cl.
*H01L 47/00* (2006.01)
(52) U.S. Cl. .............. 257/5; 257/536; 365/148
(58) Field of Classification Search ............. 257/5, 257/536; 365/148, 163
See application file for complete search history.

(56) References Cited

U.S. PATENT DOCUMENTS

| | | | |
|---|---|---|---|
| 3,621,344 A * | 11/1971 | Portnoy et al. ............. 257/485 |
| 6,391,658 B1 | 5/2002 | Gates et al. |
| 6,579,760 B1 | 6/2003 | Lung |
| 6,707,087 B2 * | 3/2004 | Fricke et al. ............. 257/296 |
| 7,351,992 B2 * | 4/2008 | Scheuerlein ............... 257/5 |
| 7,407,872 B2 * | 8/2008 | Han et al. ............... 438/483 |
| 2003/0016553 A1 * | 1/2003 | Subramanian et al. ...... 365/103 |
| 2005/0029505 A1 * | 2/2005 | Lowrey ..................... 257/5 |
| 2005/0121743 A1 * | 6/2005 | Herner ..................... 257/530 |
| 2005/0158950 A1 * | 7/2005 | Scheuerlein et al. ........ 438/257 |
| 2006/0034116 A1 * | 2/2006 | Lam et al. .................. 365/151 |

FOREIGN PATENT DOCUMENTS

WO  WO 2006/078505  7/2006

OTHER PUBLICATIONS

PCT International Search Report and Written Opinion dated Oct. 23, 2007 for International Application No. PCT/US2007/006425; 15 pages.

* cited by examiner

*Primary Examiner*—Mark Prenty

(57) ABSTRACT

A circuit comprises a bulk silicon integrated circuit (IC). A first metallization layer is arranged adjacent to said bulk silicon IC. Phase change memory (PCM) is arranged adjacent to said first metallization layer and comprises a plurality of PCM cells each including a phase-change material, a heater that selectively heats said phase-change material, and a diode in series with said phase-change material.

12 Claims, 18 Drawing Sheets

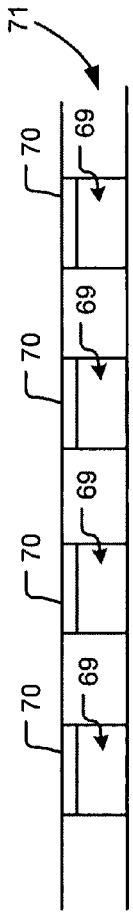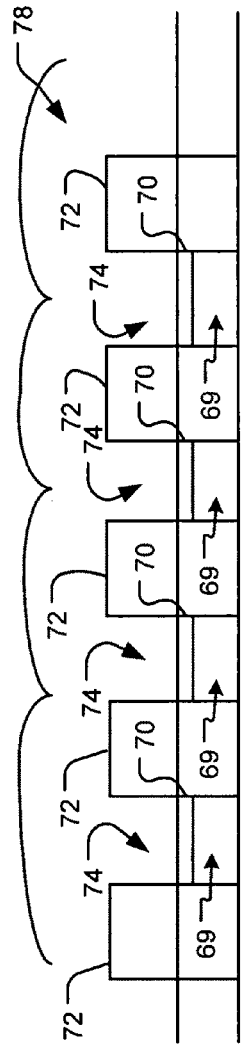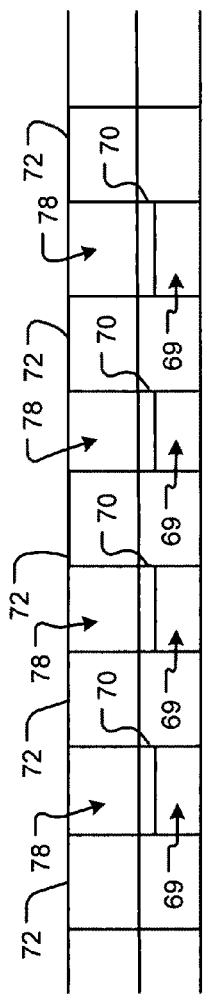

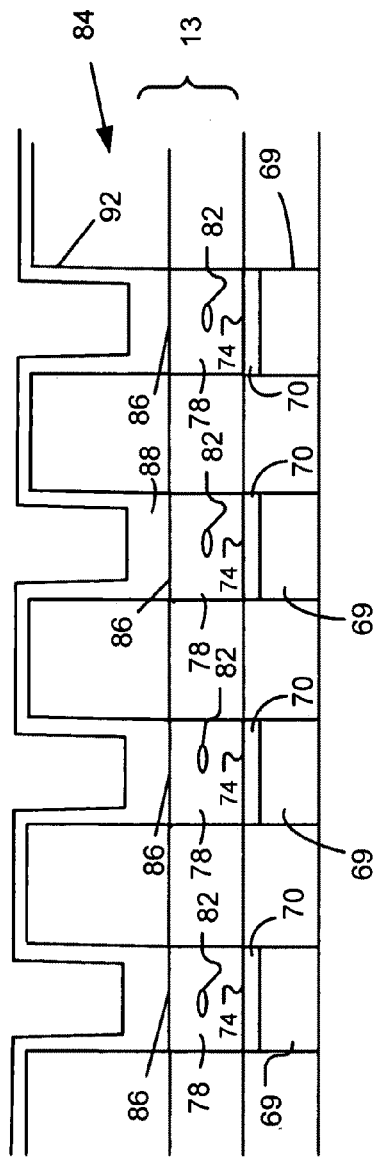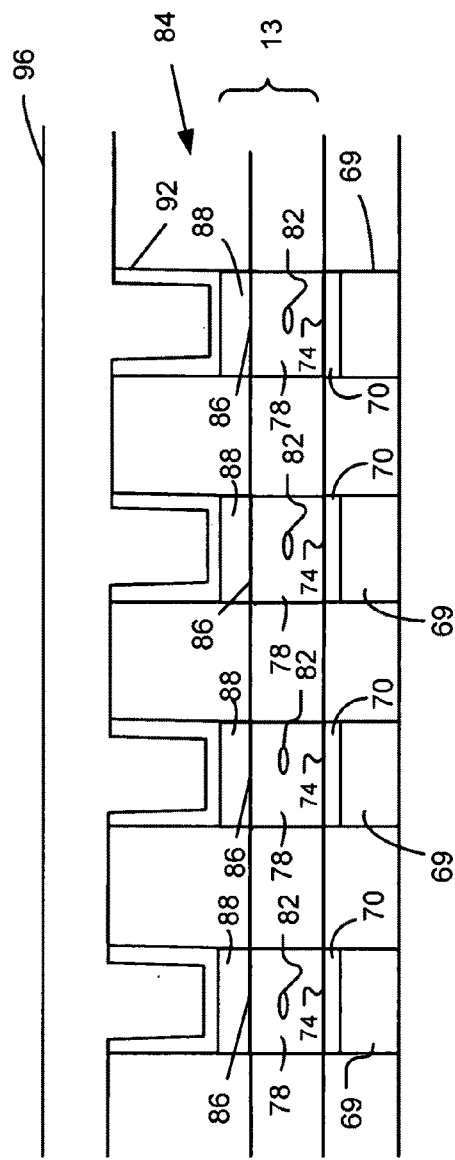

CROSS-POINT MEMORY ARRAY

CROSS-REFERENCE TO RELATED APPLICATIONS

This application is a continuation of U.S. patent application Ser. No. 11/637,967 filed on Dec. 13, 2006, and claims the benefit of U.S. Provisional Application No. 60/782,379, filed on Mar. 15, 2006. The disclosures of the above applications are incorporated herein by reference in their entirety.

FIELD

The present disclosure relates to memory and, more particularly, to memory arrays including phase-change materials.

BACKGROUND

The Background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Phase-change materials have been proposed for use in memory devices. Phase-change materials may be electrically programmed between various states. These states range from fully amorphous to fully crystalline. In a fully crystalline state, the phase-change material exhibits a low resistance. In a fully amorphous state, the phase-change material exhibits a high resistance. Phase-change materials may be used as binary memories by varying the resistance of the phase-change material.

Random access memory (RAM) utilizing phase-change materials has competed unfavorably against other memory technologies, such as flash memory. This is because flash memory typically has a density that is 2-4 times greater than the densest phase-change memory.

SUMMARY

A phase-change memory (PCM) system comprises a PCM cell array that comprises a plurality of PCM cells. Each of the PCM cells includes a diode arranged adjacent to a metallization layer. A heater element is arranged adjacent to the diode, and a phase-change material is arranged adjacent to the heater element. The diode includes an amorphous silicon layer that is deposited over the metallization layer. The amorphous silicon layer is crystallized using a seeding metal. The diode includes a Schottky diode or a junction diode. The diode thermally communicates with the metallization layer.

In other features, a system comprises the PCM system and further comprises a non-memory circuit that includes the metallization layer. The PCM system is integrated with the non-memory circuit. The diode thermally communicates with the metallization layer. In other features, a system comprises the PCM system and further comprises a memory circuit that includes the metallization layer. The PCM system is integrated with the memory circuit. The diode thermally communicates with the metallization layer. N bits of user data are stored in each of the plurality of PCM cells, where N is an integer greater than one.

In other features, a portable electronic device comprises an integrated circuit comprising a metallization layer. A block-based mass storage device comprises a PCM array integrated with the integrated circuit and arranged adjacent to the metallization layer. The PCM array comprises a plurality of PCM cells each including a diode arranged adjacent to the metallization layer, a heater element arranged adjacent to the diode, and a phase-change material arranged adjacent to the heater element. The portable electronic device is selected from a group consisting of: cell phones, laptop computers, personal digital assistants, hand-held gaming devices, and media players. N bits of user data are stored in each of the plurality of PCM cells, where N is an integer greater than one.

In other features, for the portable device, the diode includes an amorphous silicon layer that is deposited over the metallization layer. The amorphous silicon layer is crystallized using a seeding metal. The diode includes a Schottky diode or a junction diode. The diode thermally communicates with the metallization layer.

In other features, a PCM cell fabrication method comprises arranging a diode adjacent to a metallization layer and arranging a heater element adjacent to the diode. The method further comprises arranging a phase-change material adjacent to the heater element. An amorphous silicon layer is deposited over the metallization layer and crystallized using a seeding metal to form the diode. The diode includes a Schottky diode or a junction diode.

In other features, a phase-change data storage system comprises phase-change storing means for storing data. The phase-change storing means comprises a plurality of memory cells. Each of the memory cells includes current restricting means for selectively restricting current flow, and the current restricting means are arranged adjacent to a metallization layer. The memory cells further comprise heating means for heating arranged adjacent to the current restricting means. The memory cells still further comprise phase change material arranged adjacent to the heating means.

In other features, the current restricting means includes an amorphous silicon layer that is deposited over the metallization layer. The amorphous silicon layer is crystallized using a seeding material. The current restricting means includes a Schottky diode or a junction diode. The current restricting means thermally communicates with the metallization layer.

In still other features, a system comprises the phase-change data storage system and further comprises a non-memory circuit that includes the metallization layer. The phase-change data storage system is integrated with the non-memory circuit. The current restricting means thermally communicates with the metallization layer.

In other features, a system comprises the phase-change data storage system and further comprises storing means for storing data. The system includes the metallization layer. The phase-change data storage system is integrated with the storing means. The current restricting means thermally communicates with the metallization layer. N bits of user data are stored in each of the plurality of the memory cells, where N is an integer greater than one.

In other features, a portable electronic device comprises an integrated circuit that comprises a metallization layer. The integrated circuit further comprises a storage device that comprises the PCM system. The portable electronic device is selected from a group consisting of: cell phones, laptop computers, personal digital assistants, hand-held gaming devices, and media players. N bits of user data are stored in each of the plurality of cells, where N is an integer greater than one.

In other features, the current restricting means includes an amorphous silicon layer that is deposited over the metallization layer. The amorphous silicon layer is crystallized using a seeding material. The current restricting means includes a Schottky diode or a junction diode. The current restricting means thermally communicates with the metallization layer.

In still other features, a circuit comprises the PCM system and a bulk silicon transistor that communicates with the metallization layer. The bulk silicon transistor comprises a complimentary metal-oxide semiconductor (CMOS) transistor.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure

BRIEF DESCRIPTION OF THE DRAWINGS

The present disclosure will become more fully understood from the detailed description and the accompanying drawings, wherein:

FIG. 4A-4K are partial cross sections of a cross-point memory array;

DETAILED DESCRIPTION

Figure 1:
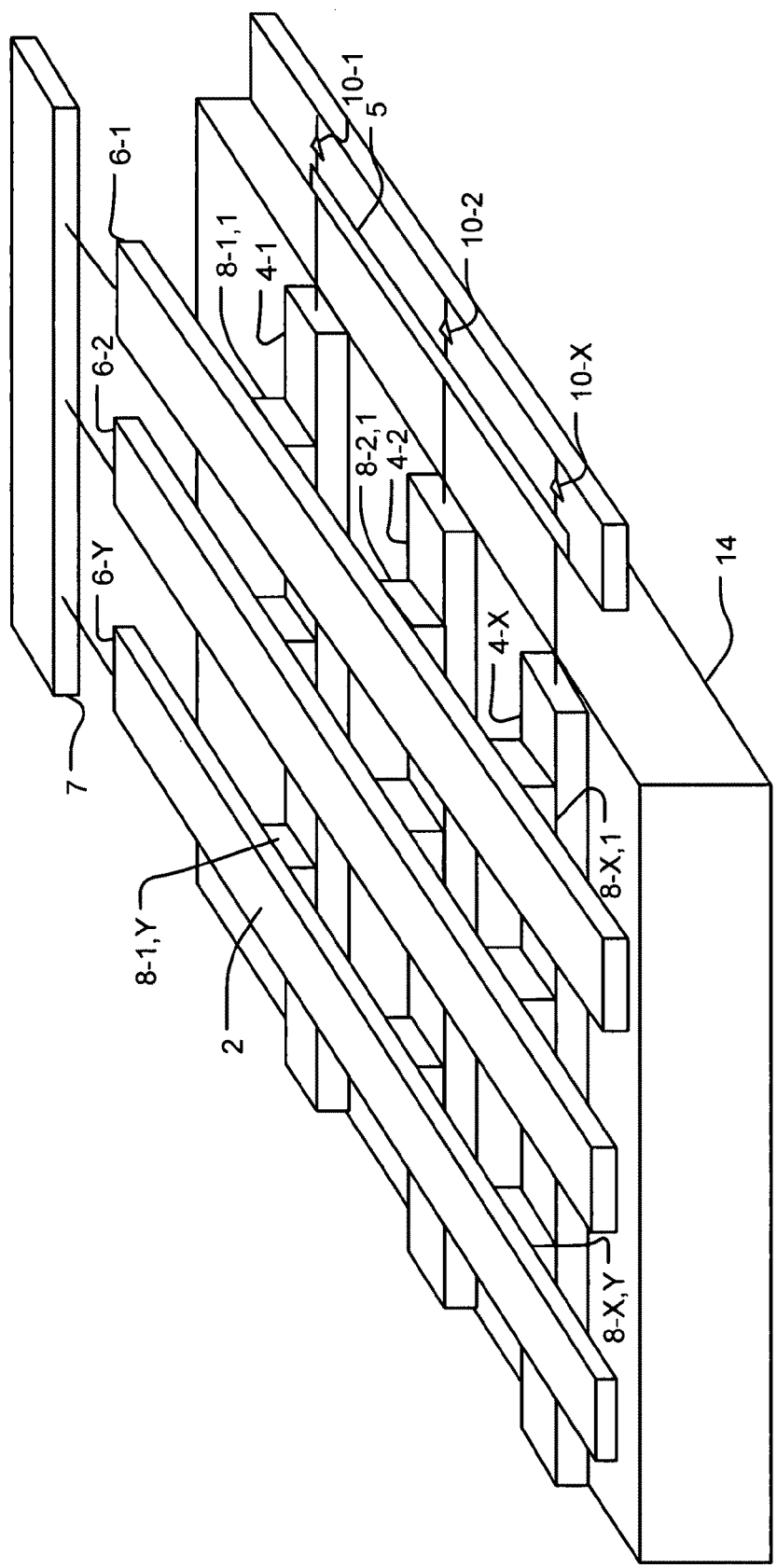
FIG. 1 is a perspective diagram of a cross-point memory array.
Figure 2C:
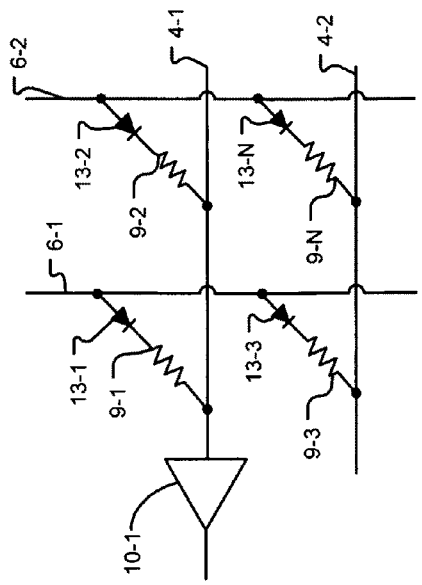
FIG. 2C is a simplified partial circuit diagram of a cross-point memory array including diodes.
Figure 2D:
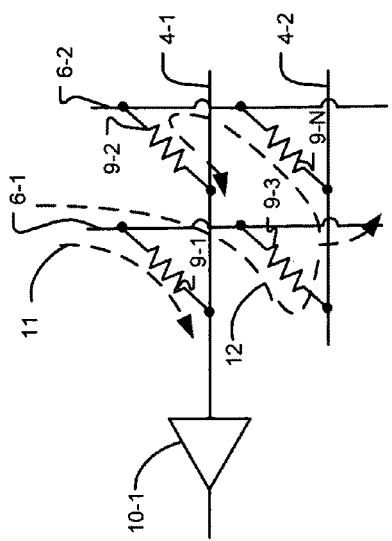
FIG. 2D is a simplified partial circuit diagram of a cross-point memory array including diodes.
Figure 2A:
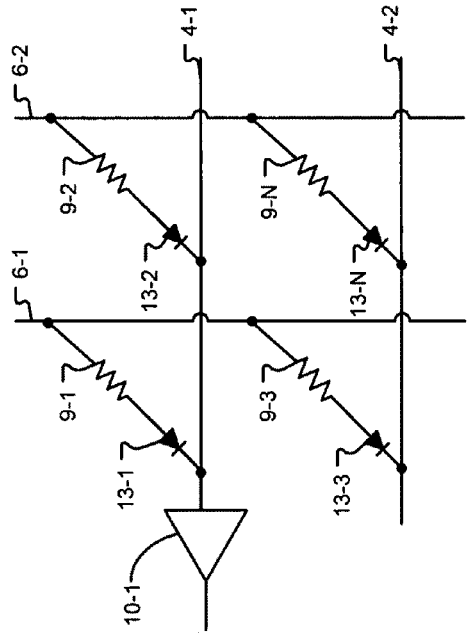
FIG. 2A is a simplified partial circuit diagram of a cross-point memory array.
Figure 2B:
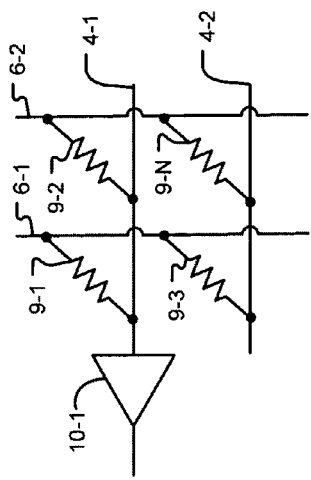
FIG. 2B is a simplified partial circuit diagram of a cross-point memory array.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. It should be understood that steps within a method may be executed in different order without altering the principles of the present disclosure.

The present disclosure describes a cross-point memory array arranged over a metallization layer of an integrated circuit. While the present disclosure will be described in conjunction with phase change memory, the present disclosure may be applicable to other memory types, such as Magnetic RAM (MRAM). Multiple cross point memory arrays may be stacked over memory or other types of circuits and tend to increase storage density and/or increase the number of memory functions.

Referring now to FIGS. 1 and 2A-2D, a cross-point memory array 2 may include row select lines 4-1, 4-2, ..., 4-X (collectively row select lines 4) that are connected to a row decoder 5. Column bit lines 6-1, 6-2, ..., 6-Y (collectively column bit lines 6) are connected to a column decoder 7. Phase-change memory cells 8-1,1, 8-1,2, ..., 8-X,Y (collectively phase change memory cells 8) are illustrated between the row and column lines 4, 6. The phase change memory cells 8 may provide variable resistances 9-1, 9-2, ..., 9-N (collectively resistances 9) that represent data. X, Y and N are integers greater than one.

Sense amplifiers 10-1, 10-2, ..., 10-X (collectively sense amplifiers 10) may read current 11 from resistance 9-1 through the row decoder 5 during a read operation. Current 12 flowing through other resistances, for example, resistances 9-2, 9-3, ..., and 9-N, may adversely affect the current 11, which may cause an error in the sensing of the data stored by the resistance 9-1. To reduce this impact, diodes 13-1, 13-2, ..., 13-N (collectively diodes 13) may be connected in series to one or both ends of the resistances 9 to reduce interference.

The cross-point memory array 2 may be constructed on a bulk silicon integrated circuit (IC) 14. One or more additional cross-point memory arrays 2 may be stacked over the first cross-point memory array 2 as will be described below.

Figure 3B:
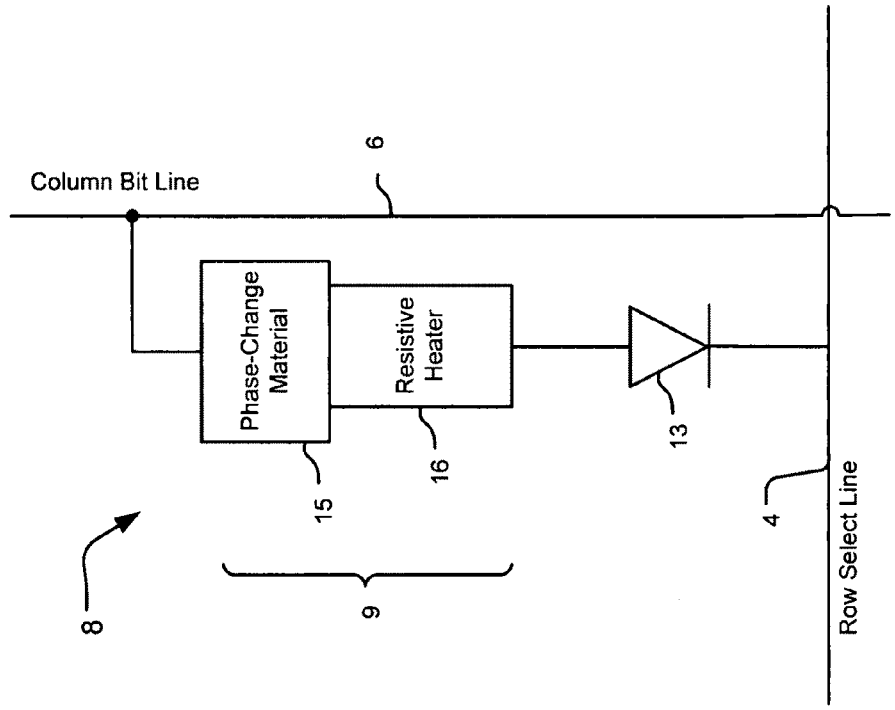
FIG. 3B is a functional block diagram of a phase-change memory cell.
Figure 3A:
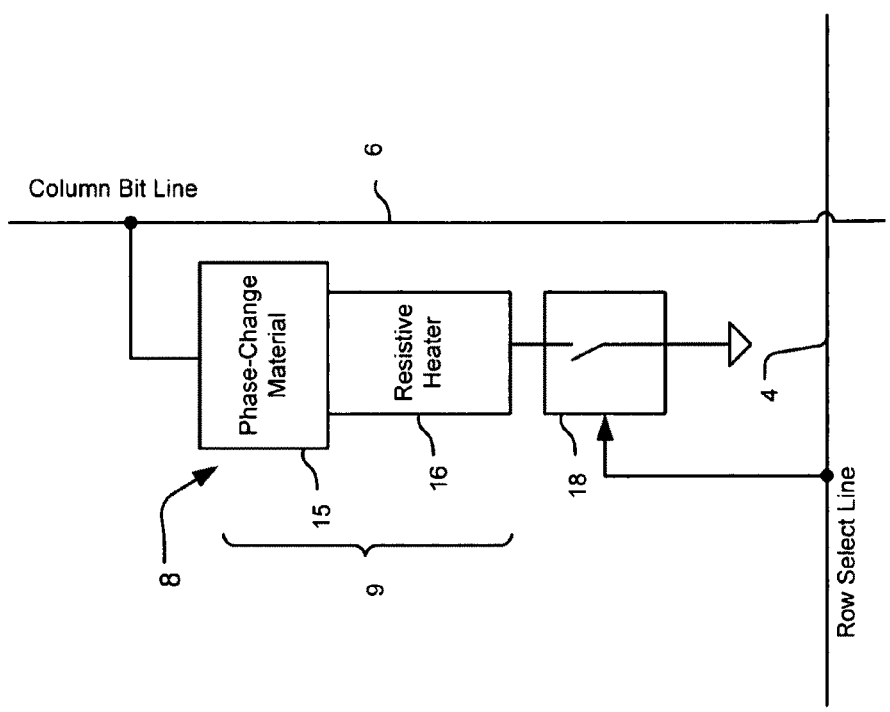
FIG. 3A is a functional block diagram of a phase-change memory cell.

Referring now to FIGS. 3A and 3B, a phase-change memory cell 8 may include a phase-change material 15, a resistive heater 16, and a select switch 18. The phase-change material 15 may be connected to a column bit line 6 and the resistive heater 16. The row select line 4 may control the select switch 18, which may be connected to the resistive heater 16. A controlled current may be used to program the phase-change memory cell 8 via the row select line 4 and the column bit line 6. In FIG. 3B, the phase-change memory cell 8 includes a diode 13.

Figure 4A:
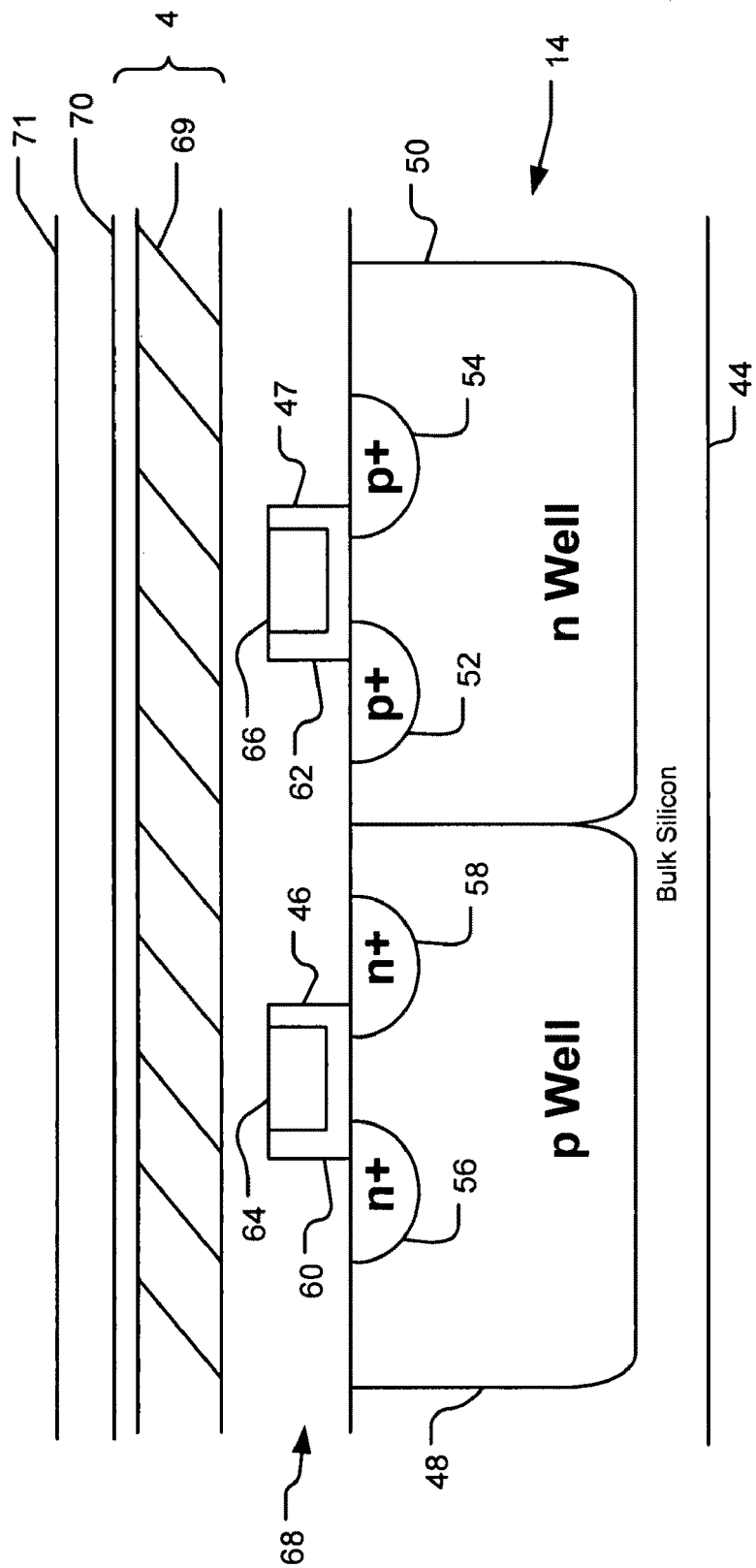

Referring now to FIGS. 1 and 4A, the bulk silicon IC 14 may include a bulk silicon substrate 44 and semiconductor components 46, 47. For example only, the semiconductor components 46, 47 may include complementary metal-oxide semiconductor (CMOS) transistors 46, 47. n and p type wells 48, 50 may be formed in the bulk silicon substrate 44 using one or more patterning, ion implantation and/or diffusion steps. The bulk silicon substrate 44 may be heated to anneal damage from the ion implantation and/or to drive diffused dopants sufficiently within the n and p type wells 48, 50.

After the n and p wells 48, 50 are formed, additional patterning and implanting steps may be used to define hole dense (p+) regions 52, 54 and/or electron dense (n+) regions 56, 58. Once the bulk silicon substrate 44 is doped, an oxide layer may be grown on the bulk silicon substrate 44. The oxide layer may be patterned in selected areas to create first gate oxide areas 60, 62. A layer of polysilicon may be deposited over the oxide layer and patterned to create gates 64, 66 in selected areas. Ions may also be implanted in the polysilicon to lower a resistance of the gates 64, 66. A first interlayer dielectric (ILD) 68 may be deposited over the bulk silicon IC 14.

Referring now to FIGS. 4A and 4B, the row select lines 4 (illustrated in a direction perpendicular to a plane of FIG. 4A) may include a metallization layer 69. For example, the metallization layer 69 may include copper. A barrier material 70 may be arranged adjacent to the metallization layer 69 and may include titanium nitride (TiN). A second ILD 71 may be deposited on the row select lines 4. The metallization layer 69 may be connected to the bulk silicon IC 14.

Referring now to FIGS. 4C and 4D, a third ILD 72 may be deposited over the row select lines 4 and may include openings 74. The openings 74 may terminate at the top of the barrier material 70. A layer of amorphous silicon (α-Si) 78 may be deposited in the openings 74. The α-Si 78 may be inactive and/or doped with ions. In FIG. 4D, chemical mechanical polishing (CMP) may be used to polish the α-Si 78, which leaves α-Si in the openings 74.

Figure 4E:
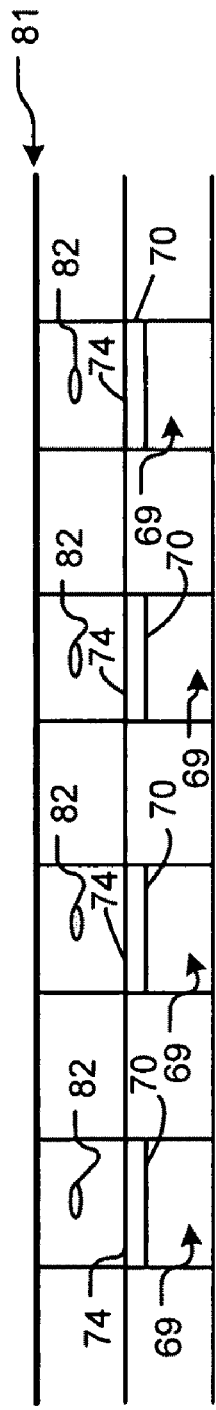

Referring now to FIG. 4E, a seeding metal layer 81, for example nickel (Ni), is deposited on the structure, then low temperature solid phase epitaxy may be used to anneal/crystallize the α-Si into crystal silicon islands 82 inside the openings 74. The remaining seeding metal layer 81 may be etched.

Figure 4F:
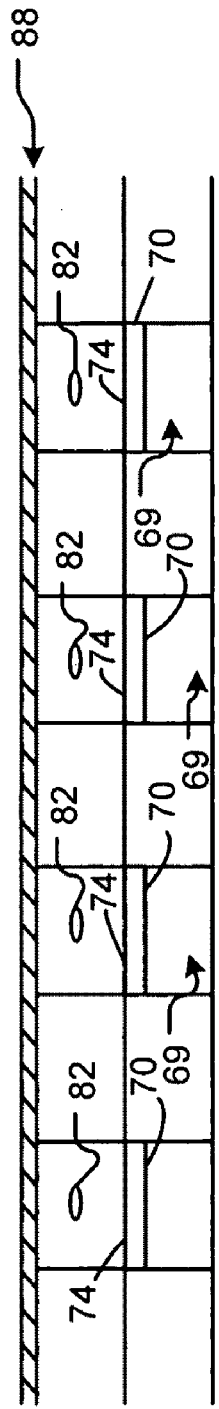
Figure 4G:
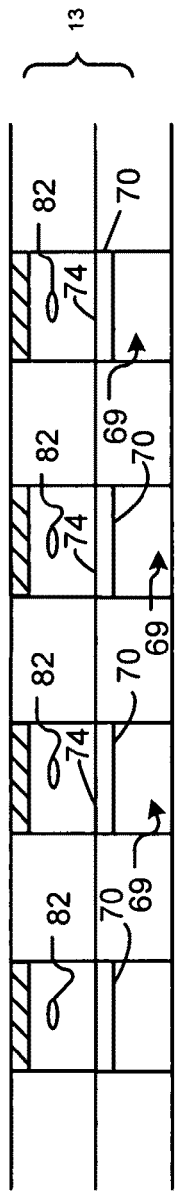

Referring now to FIGS. 4F and 4G, a metal layer 88 (for example only, titanium (Ti), tungsten (W), or titanium tungsten (TiW)) may be deposited on the structure, followed by thermal activation to form Schottky diodes on the surface of recrystallized Si islands 82. Un-reacted metal can then be removed by chemical etching. After this stage, the structure is depicted in FIG. 4G.

Figure 4H:
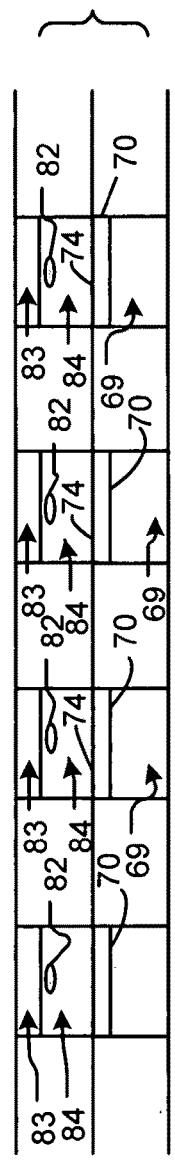

Referring now to FIG. 4H, an alternative embodiment is illustrated. If Schottky diode is not the desired diode structure a P/N junction may instead be formed. After the recrystallization to form the Si islands 82, an ion implantation step can be used to introduce dopant to the surface of the Si islands 82, followed by thermal activation to form the P/N junction (for example, P—Si 83 and N—Si 84).

Referring now to FIG. 4I, another dielectric isolation layer 84 may then be deposited over the structure. Openings 86 may be etched above the recrystallized Si islands 82, stopping at the Si island 82, which contains either a Schottky diode, or a P/N diode.

Generally, a significant amount of energy may be dissipated across the diode 13 during programming of the phase-change memory cell 8. The metallization layer 69 may act as a heat sink for the diode 13 to prevent heat-related structural damage to the diode.

Referring now to FIG. 4J, a relatively high-resistivity, high temperature-stable material 92 (for example, titanium (Ti), titanium nitride (TiN), titanium tungsten (TiW), and tungsten (W)) may be deposited on the surface of the structure. CMP may be used to remove the material 92 that is not in the openings 86. The resistive heater 16 may include the material 92. The material 92 may cover the sidewalls of the openings 86 and/or may fill the openings 86 completely. Remaining space in each of the openings 86 may be filled with an ILD 96.

Figure 4K:
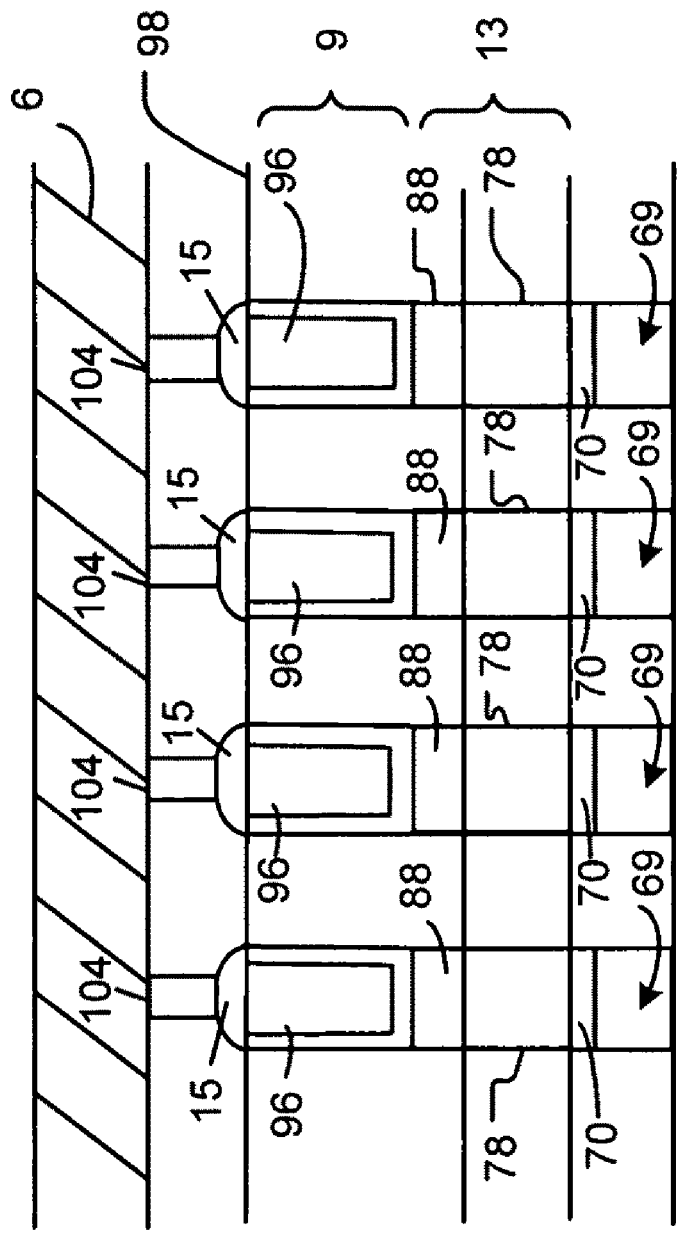

Referring now to FIG. 4K, the upper surface 98 may be cleaned to remove remaining conducting layers, and a phase-change material 15 may be deposited. For example only, the phase change material can include chalcogenide alloy. The phase-change material 15 may be connected to a metallization layer that may be patterned into column bit lines 6. Contact holes and/or plugs 104 may be formed adjacent or within the metallization layer.

Figure 5:
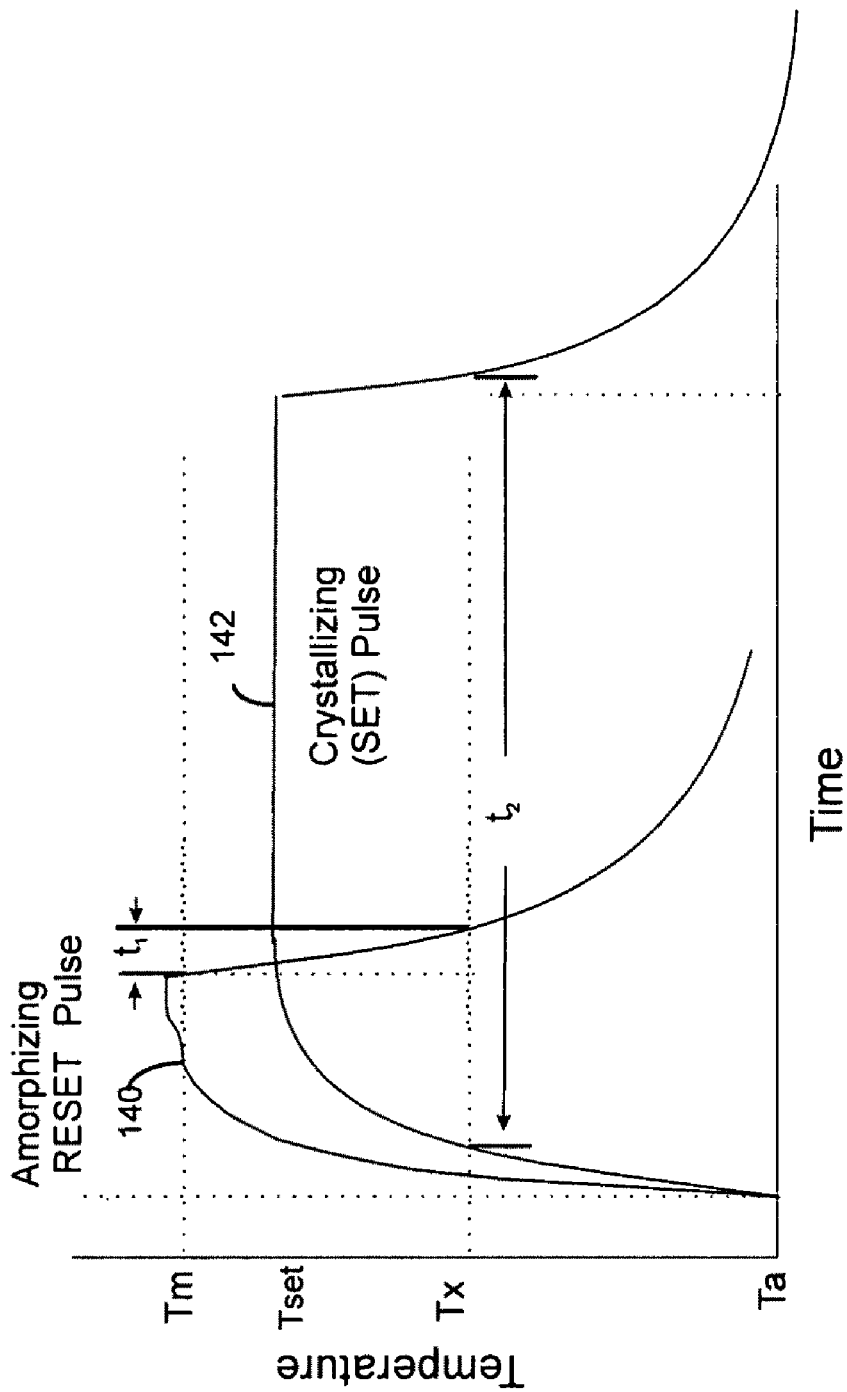
FIG. 5 is graph of a temperature profile for formation of an amorphous and crystalline state.

Referring now to FIG. 5, a phase-change memory cell can be programmed using temperature profiles 140 and 142. A RESET pulse of profile 140 heats the phase-change material above the melting temperature (Tm) and allows the material to rapidly quench during $t_1$. The quench freezes an unstructured or molten state of the material. The freezing of the unstructured state results in an amorphous or vitreous (glassy) state.

In temperature profile 142, a SET pulse heats the phase-change material to a set temperature (Tset), which is below the molten state, but above a crystallization temperature (Tx). A prolonged period ($t_2$) allows the phase-change material to re-order/anneal to a crystalline state. An alternative temperature profile may initially melt (raise to Tm) the phase-change material.

Figure 6:
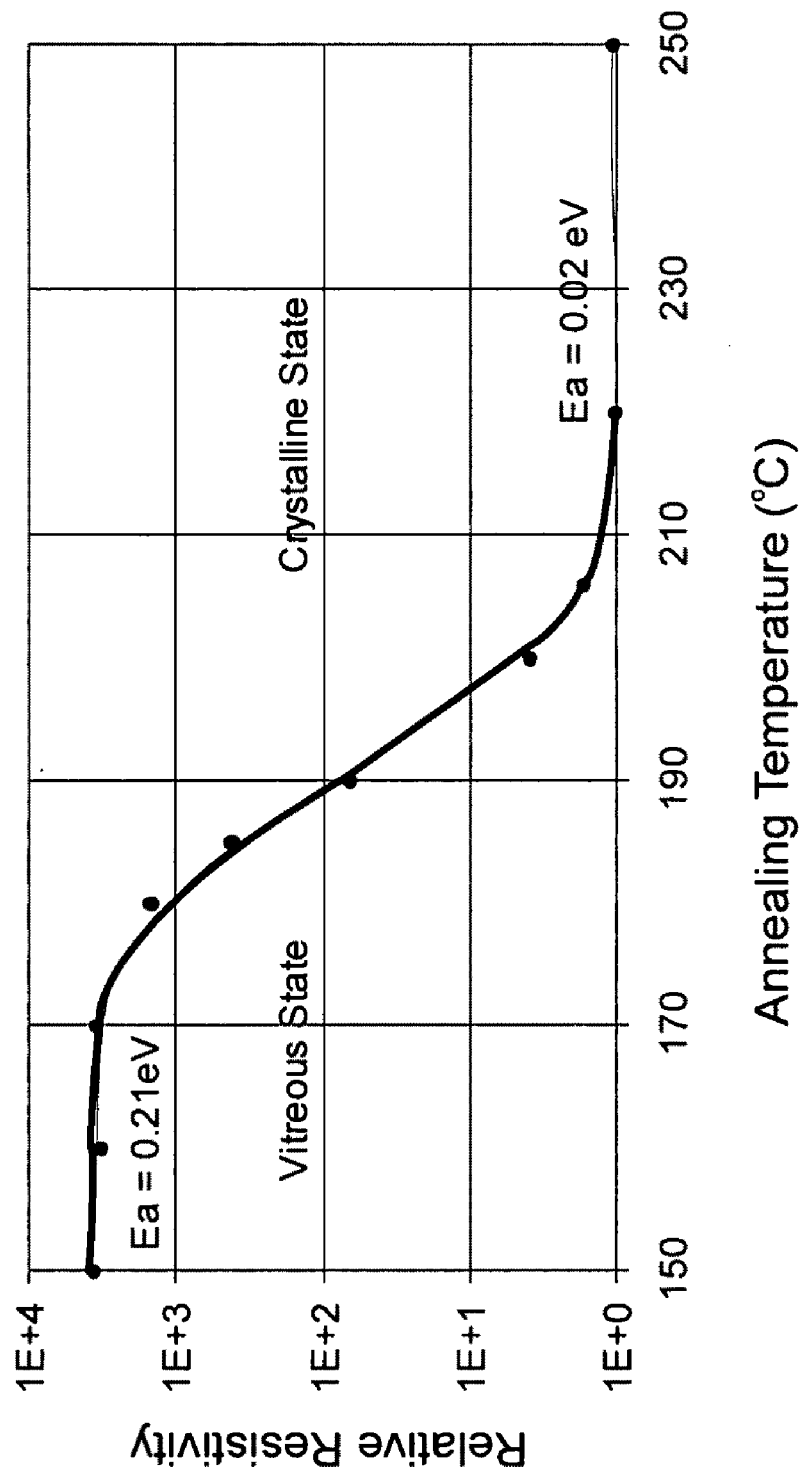
FIG. 6 is a graph of a resistivity change when an amorphous state phase-change material is annealed.

Referring now to FIG. 6, as higher set temperatures are used, relative resistivity of the phase-change material decreases in a predictable manner.

Figure 7:
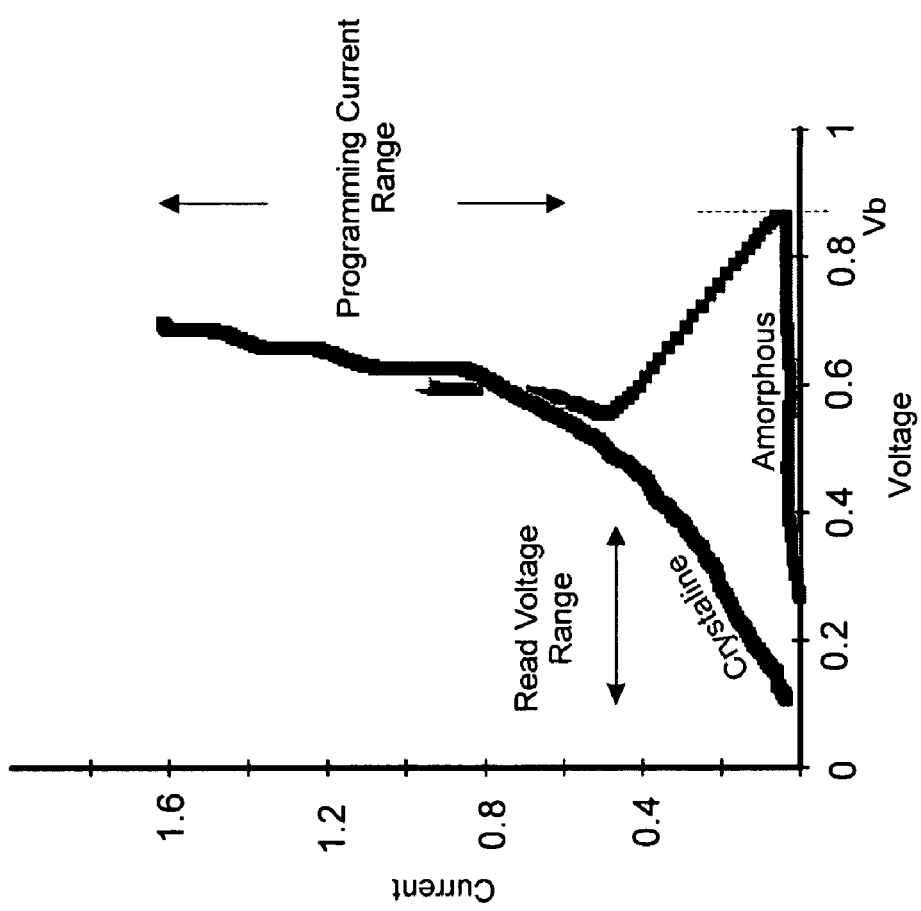
FIG. 7 is a graph of current and voltage characteristics of a phase-change material.

Referring now to FIG. 7, a voltage difference across the phase-change material may be non-linear and may exhibit break-down characteristics. A current-voltage characteristic curve may illustrate the phase-change material in a particular resistance state. A substantial amount of current may be conducted through the phase-change material by applying a voltage exceeding the breakdown voltage (Vb) using the resistive heater.

Figure 8:
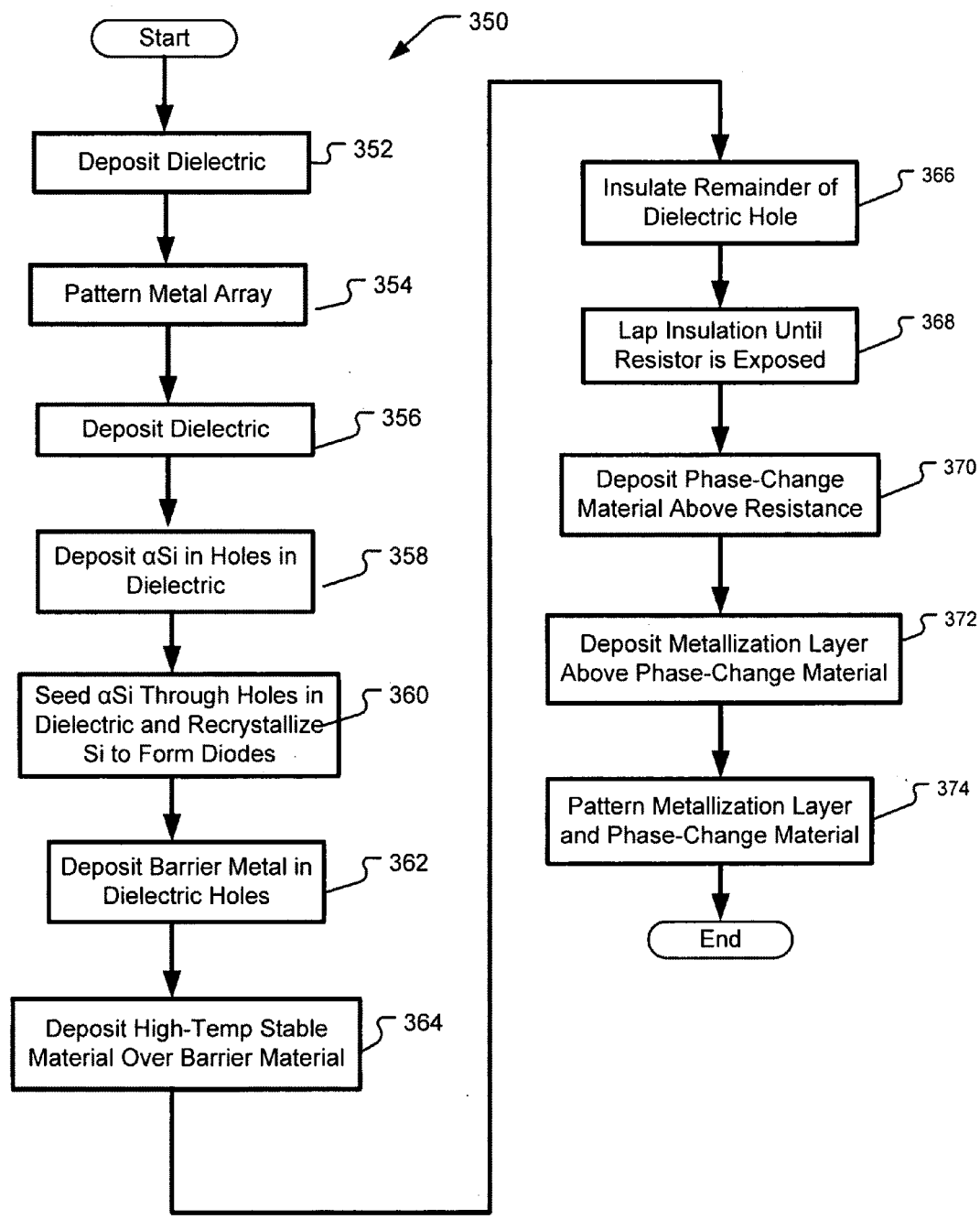
FIG. 8 illustrates a flowchart of a method for fabricating a cross-point phase-change memory array with crystalline diodes.

Referring now to FIG. 8, a flowchart 350 of steps for fabricating a cross-point phase-change memory array with diodes is illustrated. In step 352, a dielectric layer may be deposited. In step 354, a row metal array is patterned, which may include patterning barrier metal on copper rows within a dielectric. In step 356, a dielectric may be deposited above the row metal array. In step 358, openings are formed in the dielectric deposited in step 356 and filled with αSi.

In step 360, openings are formed in the dielectric, and a seeding metal is used to crystallize the αSi of step 358. Step 360 may create single crystal silicon islands (through the seeding process) from the top and/or the bottom of the αSi. When seeded from the bottom, the seeding material may be placed under the αSi and may not be removed after the αSi deposition. The seeding material generally should not interfere with the normal operation of a host device.

In step 362, un-reacted seeding metal may be removed using a suitable approach. Subsequently, a Schottky barrier metal or other barrier metal is deposited above the now seeded αSi in the openings of step 360. As previously mentioned, junction diodes may be formed instead of Schottky diodes by adding p+ doping. When junction diodes are used, the diode polarity may be more easily reversed than with a Schottky diode. Alternately, a phase-change material array may be built with SOI (silicon-on-insulator) transistor switches formed using a similar crystal seeding process.

In step 364, a high-temperature stable material is deposited having a high resistivity (resistance) within the openings of step 360 above the Schottky barrier metal. In step 366, insulation fills a remainder of space within the openings of step 360. In step 368, insulation of step 366 may be removed to expose an area of the high-temperature stable material. In step 370, a phase-change material is deposited above the high-temperature stable material. In step 372, a metallization layer is deposited above the phase-change material of step 370. In step 374, the metallization layer and the phase-change material of step 372 may be patterned.

The phase-change memory cell arrays may be organized into rows and columns of phase-change memory cells, each of which may store multiple bits of data. The larger the number of levels programmable within a phase-change memory cell of an array, the more effective number of bits each cell may be able to store.

Referring now to FIGS. 9A-9G, various exemplary implementations incorporating the teachings of the present disclosure are shown.

Figure 9A:
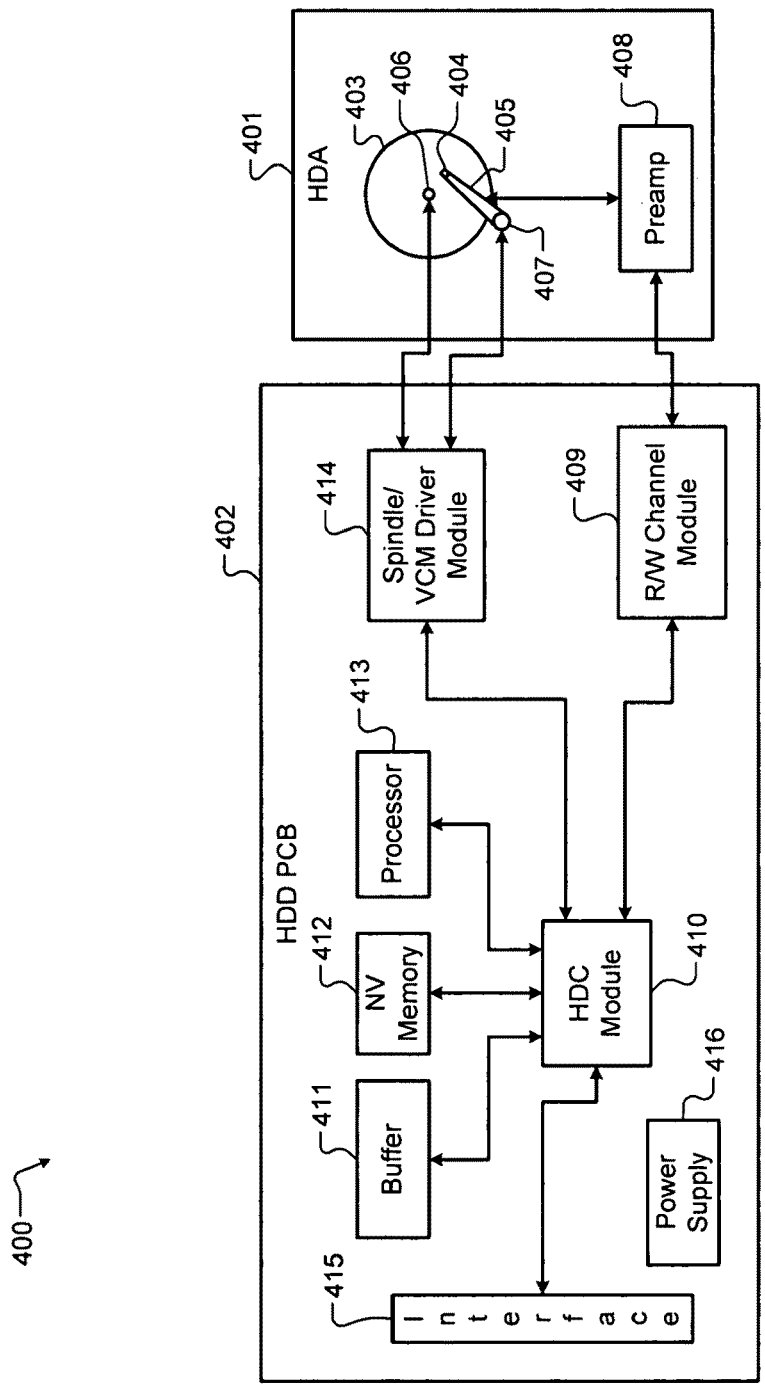
FIG. 9A is a functional block diagram of a hard disk drive.

Referring now to FIG. 9A, the teachings of the disclosure can be implemented in a memory of a hard disk drive (HDD) 400. The HDD 400 includes a hard disk assembly (HDA) 401 and a HDD PCB 402. The HDA 401 may include a magnetic medium 403, such as one or more platters that store data, and a read/write device 404. The read/write device 404 may be arranged on an actuator arm 405 and may read and write data on the magnetic medium 403. Additionally, the HDA 401 includes a spindle motor 406 that rotates the magnetic medium 403 and a voice-coil motor (VCM) 407 that actuates the actuator arm 405. A preamplifier device 408 amplifies signals generated by the read/write device 404 during read operations and provides signals to the read/write device 404 during write operations.

The HDD PCB 402 includes a read/write channel module (hereinafter, "read channel") 409, a hard disk controller (HDC) module 410, a buffer 411, nonvolatile memory 412, a processor 413, and a spindle/VCM driver module 414. The read channel 409 processes data received from and transmitted to the preamplifier device 408. The HDC module 410 controls components of the HDA 401 and communicates with an external device (not shown) via an I/O interface 415. The external device may include a computer, a multimedia device, a mobile computing device, etc. The I/O interface 415 may include wireline and/or wireless communication links.

The HDC module 410 may receive data from the HDA 401, the read channel 409, the buffer 411, nonvolatile memory 412, the processor 413, the spindle/VCM driver module 414, and/or the I/O interface 415. The processor 413 may process the data, including encoding, decoding, filtering, and/or formatting. The processed data may be output to the HDA 401, the read channel 409, the buffer 411, nonvolatile memory 412, the processor 413, the spindle/VCM driver module 414, and/or the I/O interface 415.

The HDC module 410 may use the buffer 411 and/or nonvolatile memory 412 to store data related to the control and operation of the HDD 400. The buffer 411 may include DRAM, SDRAM, etc. The nonvolatile memory 412 may include flash memory (including NAND and NOR flash memory), phase change memory, magnetic RAM, or multi-state memory, in which each memory cell has more than two states. The spindle/VCM driver module 414 controls the spindle motor 406 and the VCM 407. The HDD PCB 402 includes a power supply 416 that provides power to the components of the HDD 400.

Figure 9B:
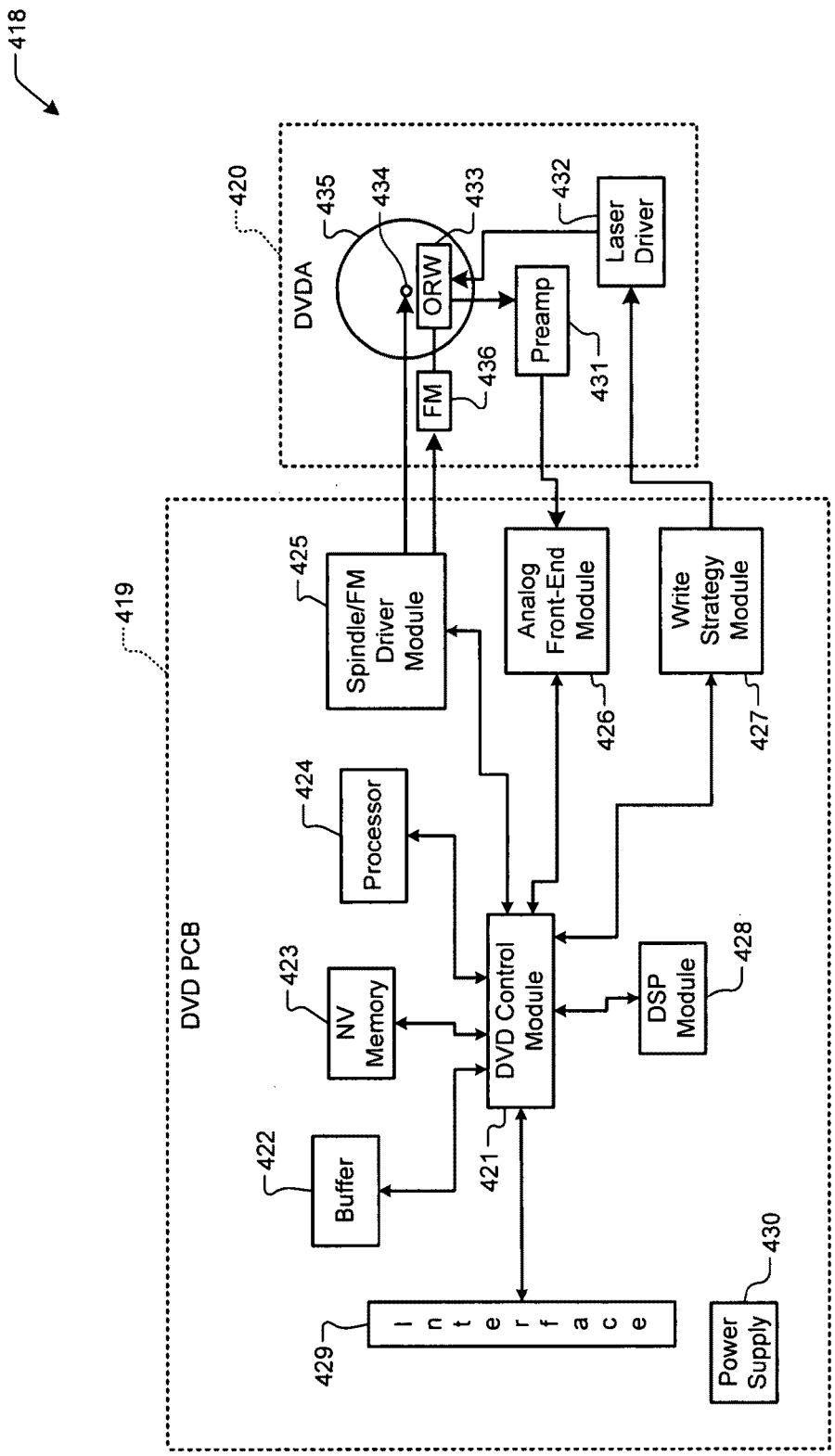
FIG. 9B is a functional block diagram of a DVD drive.

Referring now to FIG. 9B, the teachings of the disclosure can be implemented in a memory of a DVD drive 418 or of a CD drive (not shown). The DVD drive 418 includes a DVD PCB 419 and a DVD assembly (DVDA) 420. The DVD PCB 419 includes a DVD control module 421, a buffer 422, nonvolatile memory 423, a processor 424, a spindle/FM (feed motor) driver module 425, an analog front-end module 426, a write strategy module 427, and a DSP module 428.

The DVD control module 421 controls components of the DVDA 420 and communicates with an external device (not shown) via an I/O interface 429. The external device may include a computer, a multimedia device, a mobile computing device, etc. The I/O interface 429 may include wireline and/or wireless communication links.

The DVD control module 421 may receive data from the buffer 422, nonvolatile memory 423, the processor 424, the spindle/FM driver module 425, the analog front-end module 426, the write strategy module 427, the DSP module 428, and/or the I/O interface 429. The processor 424 may process the data, including encoding, decoding, filtering, and/or formatting. The DSP module 428 performs signal processing, such as video and/or audio coding/decoding. The processed data may be output to the buffer 422, nonvolatile memory 423, the processor 424, the spindle/FM driver module 425, the analog front-end module 426, the write strategy module 427, the DSP module 428, and/or the I/O interface 429.

The DVD control module 421 may use the buffer 422 and/or nonvolatile memory 423 to store data related to the control and operation of the DVD drive 418. The buffer 422 may include DRAM, SDRAM, etc. The nonvolatile memory 423 may include flash memory (including NAND and NOR flash memory), phase change memory, magnetic RAM, or multi-state memory, in which each memory cell has more than two states. The DVD PCB 419 includes a power supply 430 that provides power to the components of the DVD drive 418.

The DVDA 420 may include a preamplifier device 431, a laser driver 432, and an optical device 433, which may be an optical read/write (ORW) device or an optical read-only (OR) device. A spindle motor 434 rotates an optical storage medium 435, and a feed motor 436 actuates the optical device 433 relative to the optical storage medium 435.

When reading data from the optical storage medium 435, the laser driver provides a read power to the optical device 433. The optical device 433 detects data from the optical storage medium 435, and transmits the data to the preamplifier device 431. The analog front-end module 426 receives data from the preamplifier device 431 and performs such functions as filtering and A/D conversion. To write to the optical storage medium 435, the write strategy module 427 transmits power level and timing information to the laser driver 432. The laser driver 432 controls the optical device 433 to write data to the optical storage medium 435.

Figure 9D:
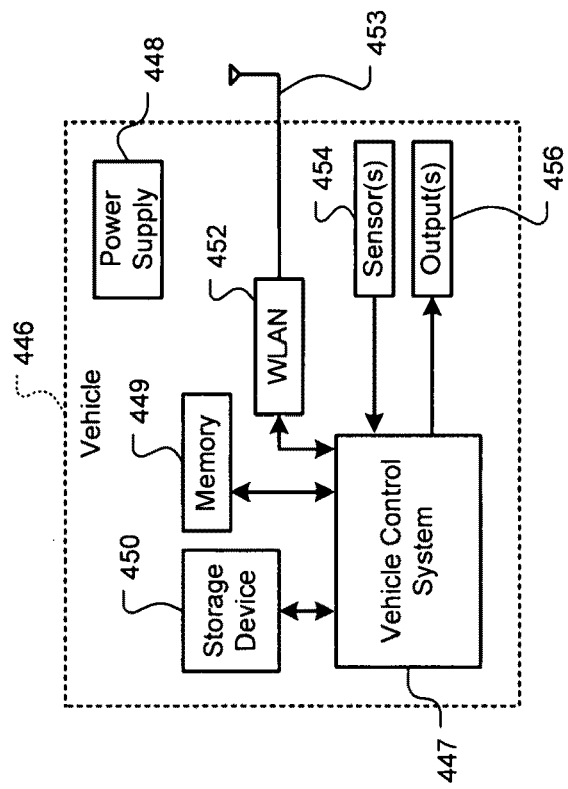
FIG. 9D is a functional block diagram of a vehicle control system.
Figure 9C:
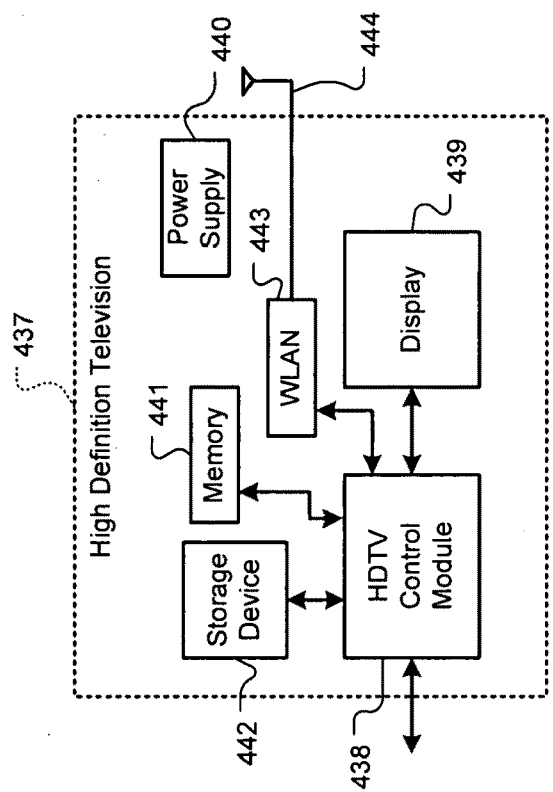
FIG. 9C is a functional block diagram of a high definition television.

Referring now to FIG. 9C, the teachings of the disclosure can be implemented in memory of a high definition television (HDTV) 437. The HDTV 437 includes a HDTV control module 438, a display 439, a power supply 440, memory 441, a storage device 442, a WLAN interface 443 and associated antenna 444, and an external interface 445.

The HDTV 437 can receive input signals from the WLAN interface 443 and/or the external interface 445, which sends and receives information via cable, broadband Internet, and/or satellite. The HDTV control module 438 may process the input signals, including encoding, decoding, filtering, and/or formatting, and generate output signals. The output signals may be communicated to one or more of the display 439, memory 441, the storage device 442, the WLAN interface 443, and the external interface 445.

Memory 441 may include random access memory (RAM) and/or nonvolatile memory such as flash memory, phase change memory, or multi-state memory, in which each memory cell has more than two states. The storage device 442 may include an optical storage drive, such as a DVD drive, and/or a hard disk drive (HDD). The HDTV control module 438 communicates externally via the WLAN interface 443 and/or the external interface 445. The power supply 440 provides power to the components of the HDTV 437.

Referring now to FIG. 9D, the teachings of the disclosure may be implemented in a memory of a vehicle 446. The vehicle 446 may include a vehicle control system 447, a power supply 448, memory 449, a storage device 450, and a WLAN interface 452 and associated antenna 453. The vehicle control system 447 may be a powertrain control system, a body control system, an entertainment control system, an anti-lock braking system (ABS), a navigation system, a telematics system, a lane departure system, an adaptive cruise control system, etc.

The vehicle control system 447 may communicate with one or more sensors 454 and generate one or more output signals 456. The sensors 454 may include temperature sensors, acceleration sensors, pressure sensors, rotational sensors, airflow sensors, etc. The output signals 456 may control engine operating parameters, transmission operating parameters, suspension parameters, etc.

The power supply 448 provides power to the components of the vehicle 446. The vehicle control system 447 may store data in memory 449 and/or the storage device 450. Memory 449 may include random access memory (RAM) and/or nonvolatile memory such as flash memory, phase change memory, or multi-state memory, in which each memory cell has more than two states. The storage device 450 may include an optical storage drive, such as a DVD drive, and/or a hard disk drive (HDD). The vehicle control system 447 may communicate externally using the WLAN interface 452.

Figure 9F:
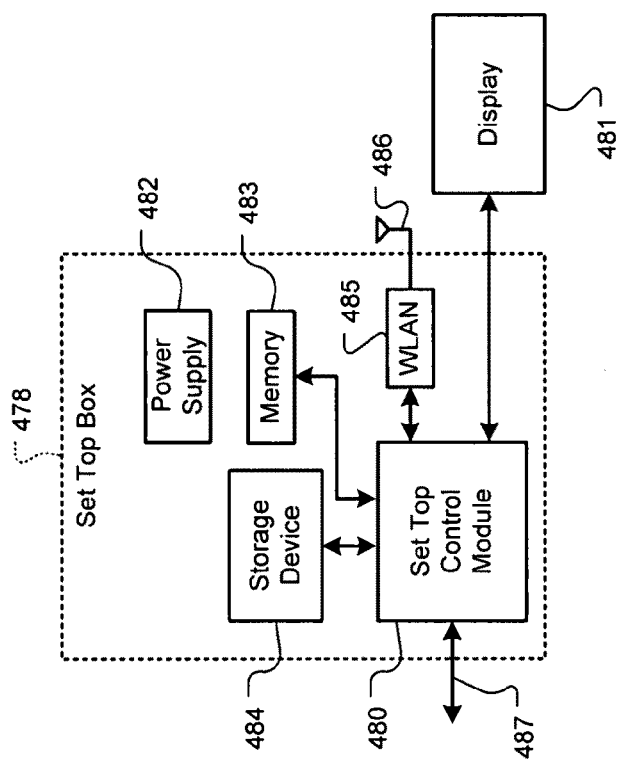
FIG. 9F is a functional block diagram of a set top box.
Figure 9E:
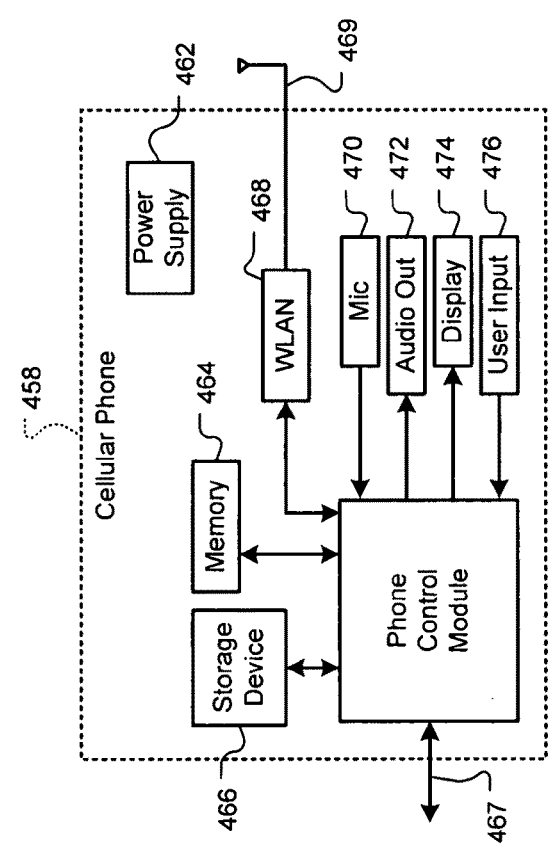
FIG. 9E is a functional block diagram of a cellular phone.

Referring now to FIG. 9E, the teachings of the disclosure can be implemented in memory of a cellular phone 458. The cellular phone 458 includes a phone control module 460, a power supply 462, memory 464, a storage device 466, and a cellular network interface 467. The cellular phone 458 may include a WLAN interface 468 and associated antenna 469, a microphone 470, an audio output 472 such as a speaker and/or output jack, a display 474, and a user input device 476 such as a keypad and/or pointing device.

The phone control module 460 may receive input signals from the cellular network interface 467, the WLAN interface 468, the microphone 470, and/or the user input device 476. The phone control module 460 may process signals, including encoding, decoding, filtering, and/or formatting, and generate output signals. The output signals may be communicated to one or more of memory 464, the storage device 466, the cellular network interface 467, the WLAN interface 468, and the audio output 472.

Memory 464 may include random access memory (RAM) and/or nonvolatile memory such as flash memory, phase change memory, or multi-state memory, in which each memory cell has more than two states. The storage device 466 may include an optical storage drive, such as a DVD drive, and/or a hard disk drive (HDD). The power supply 462 provides power to the components of the cellular phone 458.

Referring now to FIG. 9F, the teachings of the disclosure can be implemented in memory of a set top box 478. The set top box 478 includes a set top control module 480, a display 481, a power supply 482, memory 483, a storage device 484, and a WLAN interface 485 and associated antenna 486.

The set top control module 480 may receive input signals from the WLAN interface 485 and an external interface 487, which can send and receive information via cable, broadband Internet, and/or satellite. The set top control module 480 may process signals, including encoding, decoding, filtering, and/or formatting, and generate output signals. The output signals may include audio and/or video signals in standard and/or high definition formats. The output signals may be communicated to the WLAN interface 485 and/or to the display 481. The display 481 may include a television, a projector, and/or a monitor.

The power supply 482 provides power to the components of the set top box 478. Memory 483 may include random access memory (RAM) and/or nonvolatile memory such as flash memory, phase change memory, or multi-state memory, in which each memory cell has more than two states. The storage device 484 may include an optical storage drive, such as a DVD drive, and/or a hard disk drive (HDD).

Figure 9G:
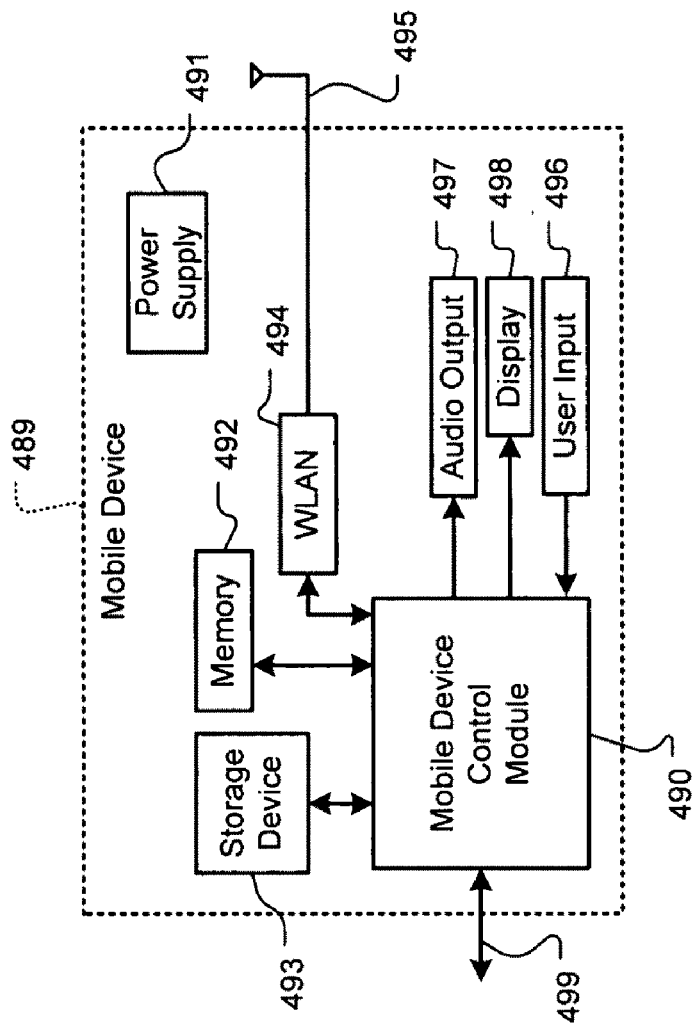
FIG. 9G is a functional block diagram of a mobile device.

Referring now to FIG. 9G, the teachings of the disclosure can be implemented in memory of a mobile device 489. The mobile device 489 may include a mobile device control module 490, a power supply 491, memory 492, a storage device 493, a WLAN interface 494 and associated antenna 495, and an external interface 499.

The mobile device control module 490 may receive input signals from the WLAN interface 494 and/or the external interface 499. The external interface 499 may include USB, infrared, and/or Ethernet. The input signals may include compressed audio and/or video, and may be compliant with the MP3 format. Additionally, the mobile device control module 490 may receive input from a user input 496 such as a keypad, touchpad, or individual buttons. The mobile device control module 490 may process input signals, including encoding, decoding, filtering, and/or formatting, and generate output signals.

The mobile device control module 490 may output audio signals to an audio output 497 and video signals to a display 498. The audio output 497 may include a speaker and/or an output jack. The display 498 may present a graphical user interface, which may include menus, icons, etc. The power supply 491 provides power to the components of the mobile device 489. Memory 492 may include random access memory (RAM) and/or nonvolatile memory such as flash memory, phase change memory, or multi-state memory, in which each memory cell has more than two states. The storage device 493 may include an optical storage drive, such as a DVD drive, and/or a hard disk drive (HDD). The mobile device may include a personal digital assistant, a media player, a laptop computer, a gaming console or other mobile computing device.

Those skilled in the art can now appreciate from the foregoing description that the broad teachings of the disclosure can be implemented as a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A circuit comprising:
a bulk silicon integrated circuit (IC);
a first metallization layer that is arranged adjacent to said bulk silicon IC;
phase change memory (PCM) that is arranged adjacent to said first metallization layer and that comprises a plurality of PCM cells, each PCM cell including:
a phase-change material,
a heater that selectively heats said phase-change material, and
a diode in series with said phase-change material, wherein said diode includes crystallized islands that are crystallized using a seeding metal layer and that are crystallized from an amorphous silicon layer that is deposited over said first metallization layer; and
a conductive barrier material arranged between said first metallization layer and said diode.

2. A circuit comprising:
a bulk silicon integrated circuit (IC);
a first metallization layer that is arranged adjacent to said bulk silicon IC; and
phase change memory (PCM) that is arranged adjacent to said first metallization layer and that comprises a plurality of PCM cells, each PCM cell including:
a phase-change material,
a heater that selectively heats said phase-change material, and
a diode in series with said phase-change material, wherein said diode includes crystallized islands chat are crystallized using a seeding metal layer and chat are crystallized from an amorphous silicon layer that is deposited over said first metallization layer, and wherein said first metallization layer comprises copper.

3. The circuit of claim 1 wherein said barrier material comprises titanium nitride.

4. A circuit comprising:
a bulk silicon integrated circuit (IC);
a first metallization layer that is arranged adjacent to said bulk silicon IC; and
phase change memory (PCM) that is arranged adjacent to said first metallization layer and that corn rises a plurality of PCM cells, each PCM cell including:
a phase-change material,
a heater that selectively heats said phase-change material, and
a diode in series with said phase-change material,
wherein said diode includes crystallized islands chat are crystallized using a seeding metal layer and chat are crystallized from an amorphous silicon layer that is deposited over said first metallization layer, and
wherein said seeding metal layer comprises nickel.

5. A circuit comprising:
a bulk silicon integrated circuit (IC);
a first metallization layer that is arranged adjacent to said bulk silicon IC; and
phase change memory (PCM) that is arranged adjacent to said first metallization layer and that comprises a plurality of PCM cells, each PCM cell including:
a phase-change material,
a heater that selectively heats said phase-change material, and
a diode in series with said phase-change material,
wherein said diode includes crystallized islands that are crystallized using a seeding metal layer and that are crystallized from an amorphous silicon layer that is deposited over said first metallization layer,
wherein said diode comprises an n-type layer,
wherein said seeding metal layer crystallizes said n-type layer, and
wherein said diode comprises a metal layer arranged adjacent to said n-type layer.

6. The circuit of claim 5 wherein said metal layer comprises titanium.

7. A system comprising:
a circuit comprising:
a bulk silicon integrated circuit (IC),
a first metallization layer that is arranged adjacent to said bulk silicon IC, and
phase change memory (PCM) that is arranged adjacent to said first metallization layer and that comprises a plurality of PCM cells, each PCM cell including;
a phase-change material,
a heater that selectively heats said phase-change material, and
a diode in series with said phase-change material, wherein said diode includes crystallized islands that are crystallized using a seeding metal layer and that are crystallized from an amorphous silicon layer that is deposited over said first metallization layer; and
a non-memory circuit that includes said first metallization layer, wherein said PCM is integrated with said non-memory circuit, and wherein said diode thermally communicates with said first metallization layer.

8. A system comprising:
a circuit comprising:
a bulk silicon integrated circuit (IC),
a first metallization layer that is arranged adjacent to said bulk silicon IC, and
phase change memory (PCM) that is arranged adjacent to said first metallization layer and that comprises a plurality of PCM cells, each PCM cell including
a phase-change material,
a heater that selectively heats said phase-change material, and
a diode in series with said phase-change material,
wherein said diode includes crystallized islands that are crystallized using a seeding metal layer and that are crystallized from an amorphous silicon layer that is deposited over said first metallization layer; and
a memory circuit that includes said first metallization layer, wherein said PCM is integrated with said memory circuit, and wherein said diode thermally communicates with said first metallization layer.

9. A circuit comprising:
a bulk silicon integrated circuit (IC);
a first metallization layer that is arranged adjacent to said bulk silicon IC; and
phase change memory (PCM) that is arranged adjacent to said first metallization layer and that comprises a plurality of PCM cells, each PCM cell including:
a phase-change material,
a heater that selectively heats said phase-change material, and
a diode in series with said phase-change material,
wherein said diode includes crystallized islands that are crystallized using a seeding metal layer and that are crystallized from an amorphous silicon layer that is deposited over said first metallization layer, and
wherein N bits of user data are stored in each of said plurality of PCM cells, where N is an integer greater than one.

10. A circuit comprising:
a bulk silicon integrated circuit (IC);
a first metallization layer that is arranged adjacent to said bulk silicon IC; and
phase change memory (PCM) that is arranged adjacent to said first metallization layer and that cormprises a plurality of PCM cells, each PCM cell including:
a phase-change material,
a heater that selectively heats said phase-change material, and
a diode in series with said phase-change material,
wherein said diode includes crystallized islands that are crystallized using a seeding metal layer and that are crystallized from an amorphous silicon layer that is deposited over said first metallization layer,
wherein said heater includes a resistive material partially surrounding a dielectric material,
wherein said resistive material and said dielectric material form a first planar surface, and
wherein said phase-change material includes a second planar surface arranged adjacent to said first planar surface of said heater element.

11. The circuit of claim 10,
wherein said first metallization layer includes a first side and a second side, wherein said bulk silicon IC comprises a transistor that is adjacent to said first side of said first metallization layer, and wherein said diode is arranged adjacent to said second side of said first metallization layer.

12. The circuit of claim 5 wherein said metal layer of said diode is arranged between said n-type silicon layer and said heater.

* * * * *